May 14, 1957 J. J. SURAN ET AL 2,792,494

SEMICONDUCTOR SUPERREGENERATIVE DETECTOR

Filed Jan. 31, 1955

INVENTORS:
WOO FOUNG CHOW,
JEROME J. SURAN,
BY George V. Eltgroth
THEIR ATTORNEY.

2,792,494
Patented May 14, 1957

2,792,494

SEMICONDUCTOR SUPERREGENERATIVE DETECTOR

Jerome J. Suran and Woo Foung Chow, Syracuse, N. Y., assignors to General Electric Company, a corporation of New York Application January 31, 1955, Serial No. 484,942

9 Claims. (Cl. 250—20)

This invention relates to superregenerative detector circuits and more particularly to circuits of this character utilizing semiconducting devices.

Superregenerative detector circuits have found large application in radio receiver design because of large radio frequency amplification for frequencies difficult to amplify using conventional means. These circuits simplify, and in many cases, eliminate radio frequency and intermediate frequency amplifier stages. Its simplified circuitry produces a light, small and efficient receiver.

It is an object of the present invention to provide a new and improved superregenerative detector.

The superregenerative detector consists primarily of a radio frequency oscillator which is passed in and out of oscillatory condition at a rate called the quench frequency, which is higher than the modulation frequencies to be received. The quench frequency oscillator of the present invention utilizes a double-base diode, and the radio frequency oscillator utilizes a junction type transistor. Among the objects of the present invention is the provision of a new and novel circuit for interconnecting the quench frequency oscillator and the radio frequency oscillator.

A further object of this invention resides in the application of the quench frequency oscillation to the radio frequency oscillator which effectively controls the period of time in which the radio frequency oscillator operates.

A still further object of the present invention is the provision of means for reducing the critical nature of the tuning of the radio frequency oscillator.

These and other advantages of this invention will be more clearly understood from the following description taken in connection with the accompanying drawings. The new and novel features that are considered characteristic of this invention are set forth with particularity in the appended claims.

Figure 1:
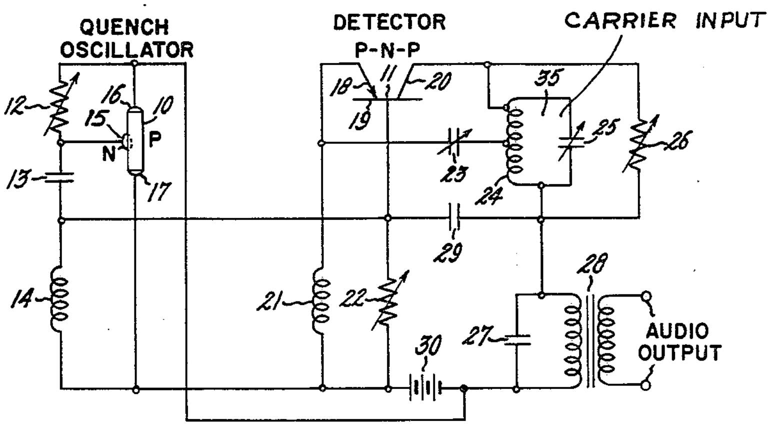
Fig. 1 is a diagrammatic illustration of the invention.

Fig. 1 shows an illustrative embodiment of a superregenerative detector utilizing semiconducting devices. In order to utilize a common source of potential, an NP type double-base diode is used in combination with a PNP junction-type transistor. As will appear obvious to those skilled in the art, a PN double-base diode may be used in combination with an NPN junction type transistor in the same circuit provided that the polarities of the potential source are reversed.

The radio frequency oscillator portion of the circuit shown in Fig. 1 comprises a resonant circuit 35, and PNP transistor 11 regeneratively coupled to the resonant circuit 35. Collector 20 of transistor 11 is connected to resonant circuit 35 which is in turn regeneratively coupled to the emitter 18 of transistor 11 through coupling capacitor 23. The positive terminal of source of potential 30 is connected through inductance 21 to the emitter 18 of transistor 11. The output of the superregenerative circuit is obtained at the output transformer 28. A variable resistance 26 may be connected across resonant circuit 35. The addition of variable resistance 26 will effectively load the resonant circuit 35 which will effectively reduce the critical nature of the tuning of the radio frequency oscillator by control of the "Q" of said resonant circuit. Capacitance 29 which is connected between the resonant circuit 35 and the base 19 of transistor 11 is used to bypass radio frequencies. Capacitor 27 which is connected across the primary winding of transformer 28 is used to bypass the quench oscillator frequency. A variable resistance 22 is connected between base 19 and source of potential 30 to control the quench wave applied to the transistor.

The quench frequency oscillator portion of the circuit shown in Fig. 1 comprises an NP double base diode 10 connected in circuit as a relaxation oscillator. The characteristics of a double base diode are shown and described in the copending application of I. A. Lesk, Serial No. 341,164, filed March 9, 1953, and assigned to the present assignee, and need not be considered in detail here. The only consideration necessary in this presentation is that the double-base diode 10 functions in circuit as an oscillator. The positive and negative terminals of source 30 are connected to ohmic contacts 16 and 17 respectively of double base diode 10. A variable resistance 12 is connected between ohmic contact 16 and junction 15 of the double-base diode 10 and is used to control the quench frequency. Junction 15 of double-base diode 10 is also connected through capacitance 13 in series with inductance 14 to ohmic contact 17. With this configuration, capacitor 13 charges through the back resistance of junction diode 15 and resistance 12. The voltage across capacitance 13 will continue to build up until the N region of junction 15 becomes negative relative to the P region of junction 15. At this time, capacitance 13 will discharge through the forwardly biased junction 15 and through inductance 14. Inductance 14 "shapes" the oscillation waveform of the double-base diode to approximate a sine-wave. Since the double base diode inherently exhibits a negative resistance characteristic, and an operating point is chosen to occur in this negative resistance region, then the circuit will continue to oscillate, thus functioning as a relaxation oscillator. The output of this oscillator is taken across inductance 14 in order to prevent loading of the quench frequency oscillator.

The superregenerative detector of Fig. 1 operates by passing the radio frequency oscillator into and out of self-oscillatory condition. This is accomplished by applying the quench frequency signal developed across inductance 14 to the base 19 of transistor 11. In Fig. 1, the quench signal is applied to base 19 across variable resistance 22. Actually, variable resistance 22 would not be necessary to provide an operative result because a low impedance D. C. path is provided from the source of potential 30 through inductance 14 to base 19 of PNP transistor 11. However, resistor 22 provides a means for controlling the quench cycle.

Figure 2:
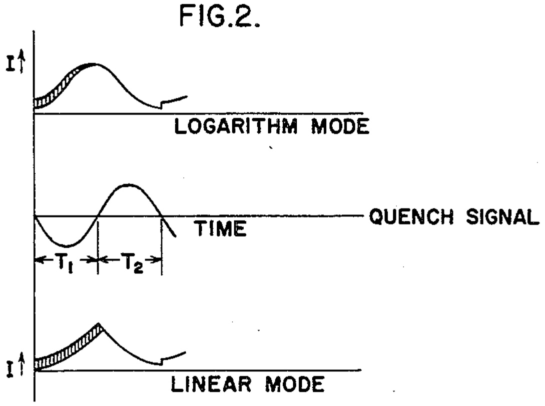
Fig. 2 illustrates the operating characteristics of the invention shown in Fig. 1.

When the quench signal voltage shown in Fig. 2 swings negative, the base 19 of PNP transistor 11 will be biased such that the transistor is active. At this time any noise signal current or R.-F. signal current will start an oscillation. This oscillation will continue to build up until the quench frequency signal swings positive which will bias transistor 11 to cutoff. If the build-up period of the oscillation is allowed to continue, it will reach a value to which the transistor will no longer be able to respond to linearly, and the collector current will be logarithmically related to the signal or noise currents. This type of operation is shown on the upper curve of Fig. 2. However, if the build-up time $T_1$ is not sufficiently long to cause saturation of oscillation of the transistor 11, the collector current will be related linearly to the signal or noise current. This mode of operation is shown on the lower curve of Fig. 2. By inserting variable resistance 22 in the base 19 and applying the quench frequency signal across variable resistance 22, the mode of operation of the detector may be controlled.

Radio frequency signals may be applied to the resonant circuit 35 by inductive coupling to inductance 24, or inductance 24 may be used as a pickup coil to obtain the signal frequency. As the quench frequency is applied to the base 19 of transistor 11, the circuit begins the build-up period. The radio frequency signal increases the emitter current of transistor 11 which likewise increases the collector current. Therefore, the amplitude of oscillation depends on the envelope of the radio frequency signal which is sampled by the quench frequency oscillator. The variation in emitter current also appears as a variation in collector current either logarithmically or linearly depending on the mode of operation used. Fig. 2 shows the effect of a signal current (shaded) on the amplitude of the oscillation of the R.-F. oscillator. The variation in collector current provides an output which corresponds to the applied signal. Transformer 28 is used to obtain the audio output, and may be coupled to an audio amplifier and a loudspeaker (not shown) to complete the receiver. For some applications, the transformer 28 may be replaced by a set of headphones (not shown), in which case the disclosed circuit would comprise the complete receiver.

Regardless of whether the mode of operation be linear or logarithmic, the decay time $T_2$, as shown on Fig. 2, must be sufficiently long to insure that the amplitude of oscillation tapers off to a value less than the noise and signal currents. If not, the envelope of the oscillation will not duplicate that of the input signal frequency. It should be further noted that the described circuit will oscillate in the absence of a desired signal frequency. This is due to a noise signal inherent in the circuit. If the signal voltage is greater than the agitation noise signal, then the oscillations build-up corresponding to the amplitude of the superimposed signal rather than to the amplitude of the smaller noise signal.

Results of experimental studies indicate that the disclosed circuit provides high gain (of the order of 50 to 60 db) at a frequency at which an ordinary amplifier has only 20 to 30 db gain. In one experimental embodiment of the invention, an overall gain of 53 db was obtained using the following circuit data:

(*a*) Battery 30—3 volts
(*b*) Quench signal—100 millivolts, 15 kc. sine-wave applied across base 19 and the positive terminal of battery 30 having an impedance of approximately 3,000 ohms
(*c*) Impedance of tank circuit 35—80,000 ohms
(*d*) R.-F. carrier input—10 μv., 1.2 mc. signal modulated by 1,000 C. P. S. at 60% modulation
(*e*) Output impedance of transistor 11 between collector electrode 20 and the negative terminal of battery 30—11,000 ohms
(*f*) Output signal across the secondary winding of transformer 28—1,000 C. P. S., 2 millivolts These results show that the disclosed transistorized circuit operates efficiently as a superregenerative detector. It is to be understood that the above-described circuit parameters are merely illustrative of the application of the principles of the invention and may vary according to the design for any particular application.

Since other modifications and changes varied to fit particular operating requirements and environments will be apparent to those skilled in the art, the invention is not considered limited to the examples chosen for purposes of disclosure and covers all modifications which do not constitute departures from the true spirit and scope of this invention.

What we claim as new and desire to secure by Letters Patent of the United States is:

1. A circuit comprising a quench oscillator means having a single junction, plural electrode semiconducting device, a source of potential, means connecting said source of potential between said electrodes, a resistance, means connecting said resistance between an electrode and junction of said device, a capacitance and an inductance, means connecting said capacitance and said inductance between another electrode and said junction of said semiconducting device, a transistor having an emitter, base and collector electrodes, a tuned circuit, means regeneratively coupling said tuned circuit with said transistor, means coupling said base electrode with said inductance of said quench oscillator means, another inductance, means connecting said emitter electrode through said other inductance to said source of potential and output means coupled to said tuned circuit.

2. The circuit defined in claim 1 including a variable resistance connected across said tuned circuit.

3. The circuit defined in claim 1 including a variable resistance connected between said base electrode and said source of potential.

4. A detector circuit comprising a quench oscillator having a single junction, two electrode semiconducting device, a source of potential, means connecting said source of potential between said two electrodes, a resistance, means connecting said resistance between one of said two electrodes and said junction, a capacitance and an inductance connected in series and means connecting said capacitance and said inductance between said junction and the other of said two electrodes, a transistor having a base, collector and emitter, means coupling said inductance to the base of said transistor, a resonant circuit, means regeneratively coupling said resonant circuit between the collector and emitter of said transistor, output means, means coupling said output means with said resonant circuit and said source of potential, a second inductance and means coupling said emitter through said inductance to said source of potential.

5. The circuit defined in claim 4 including a variable resistance connected across said resonant circuit.

6. The circuit defined in claim 4 including a variable resistance connected between said base and said source of potential.

7. A superregenerative detector circuit comprising a resonant circuit, a transistor regeneratively coupled to said resonant circuit, means for periodically varying the regeneration in said circuit, said means being an oscillator which includes a single junction, two electrode semiconducting device, a source of potential connected between said two electrodes, a resistance, means connecting said junction of said semiconducting device, a capacitance and inductance, means conducting said junction through said capacitance and said inductance to the other of said electrodes of said semiconducting devices, and means coupling said oscillator to said transistor.

8. A detector circuit comprising a quench oscillator having a single junction, two-electrode semiconducting device, a source of potential, means connecting said source of potential between said two electrodes, a resistance, means connecting said resistance between one of said two electrodes and said junction, a capacitance and an inductance connected in series and means connecting said capacitance and said inductance between said junction and the other of said two electrodes, a transistor having base, collector and emitter electrodes, means coupling said inductance to the base electrode of said transistor, a resonant circuit, means regeneratively coupling said resonant circuit between the collector and emitter electrodes of said transistor, output means, means coupling said output means with said resonant circuit and said source of potential, a second inductance and means coupling said emitter electrode through said inductance to said source of potential, a variable resistance connected across said resonant circuit, and another variable resistance connected between said base electrode and said source of potential.

9. A superregenerative circuit comprising an active semiconducting device having an emitter, base and collector electrodes, a tank circuit, means regeneratively coupling said tank circuit between said collector electrode and said emitter electrode, an inductance and a source of potential, means connecting said emitter through said inductance to said source of potential, quench oscillator means, means coupling said quench oscillator means to said source of potential and to the base electrode of said transistor, a variable resistance connected between said base electrode and said source of potential, and output means linked to said tank circuit.

References Cited in the file of this patent

UNITED STATES PATENTS

| | | |
|---|---|---|
| 2,076,168 | Turner | Apr. 6, 1937 |
| 2,644,925 | Kros | July 7, 1953 |

FOREIGN PATENTS

| | | |
|---|---|---|
| 486,620 | Canada | Sept. 16, 1952 |

OTHER REFERENCES

Electronics Magazine, December 1954, page 182 and 184, (news item on General Radio Cor. Transistor Audio Oscillator).